United States Patent
Ruuskanen

(10) Patent No.: US 6,904,113 B2
(45) Date of Patent: Jun. 7, 2005

(54) CONTROL OF PHASE LOCKED LOOP DURING CHANGE OF SYNCHRONIZATION SOURCE

(75) Inventor: Markku Ruuskanen, Porvoo (FI)

(73) Assignee: Nokia Corporation, Espoo (FI)

( * ) Notice: Subject to any disclaimer, the term of this patent is extended or adjusted under 35 U.S.C. 154(b) by 129 days.

(21) Appl. No.: 10/017,888

(22) Filed: Dec. 12, 2001

(65) Prior Publication Data

US 2002/0048337 A1 Apr. 25, 2002

Related U.S. Application Data

(63) Continuation of application No. PCT/FI00/00557, filed on Jun. 21, 2000.

(30) Foreign Application Priority Data

Jul. 1, 1999 (FI) .................................................. 991507

(51) Int. Cl.$^7$ ............................................... H03D 3/24
(52) U.S. Cl. ...................................................... 375/376
(58) Field of Search ................................ 375/376, 354, 375/357, 371, 373, 375, 277, 270, 301; 329/326, 360; 327/147, 156; 342/103

(56) References Cited

U.S. PATENT DOCUMENTS

| | | | |
|---|---|---|---|
| 5,268,655 A | * 12/1993 | Dong | ........................... 331/16 |
| 5,473,533 A | 12/1995 | Mengelt | |
| 5,701,602 A | 12/1997 | Shimoda | |
| 5,703,914 A | 12/1997 | Nakamura | |
| 5,861,842 A | 1/1999 | Hitch et al. | |

FOREIGN PATENT DOCUMENTS

| | | |
|---|---|---|
| EP | 0385134 | 9/1990 |
| EP | 0571853 | 12/1993 |

* cited by examiner

Primary Examiner—Khai Tran
(74) Attorney, Agent, or Firm—Squire, Sanders & Dempsey, L.L.P.

(57) ABSTRACT

The invention concerns a function taking place in a digital phase lock, when it is desired to exchange a synchronization signal supplied to the phase lock for another synchronization signal. Using a cut-off circuit, the phase difference between a selected reference signal and a signal formed by dividing from an oscillator signal is set with time constant accuracy at the setting value for the phase difference. The method according to the invention, then uses as phase setting value the current value of the phase difference obtained by cut-off connection. Thus, the method according to the invention begins using a reference signal-specific setting value instead of a fixed setting value. Since the setting value is determined adaptively in accordance with the signal of the synchronization source used at each time, no phase transfer will occur during the change.

6 Claims, 4 Drawing Sheets

CONTROL OF PHASE LOCKED LOOP DURING CHANGE OF SYNCHRONIZATION SOURCE

This application is a continuation of international application serial number PCT/FI00/00557, filed Jun. 21, 2000.

FIELD OF THE INVENTION

This invention concerns a function taking place in a digital phase lock, when it is desired to exchange a synchronisation signal supplied to the phase lock for another synchronisation signal.

TECHNICAL BACKGROUND

In telecommunication systems, node equipment transmits and receives data from each other through a transmission network connecting the nodes. Data cannot be received correctly unless the clock of the receiving circuit is synchronised with the frequency and phase of the incoming data. Almost without exception, the clock frequency of the receiving circuit is formed by a PLL (Phase Locked Loop).

The purpose of the phase lock is to remove jitter, migration and other interfering components occurring in the synchronisation signal. A long transmission distance will affect signal quality, and a distorted input signal makes great demands on the clock signal regeneration block.

If a trouble situation occurs on the route of the synchronisation signal, another synchronisation source may have to be used, whereby the phase lock will exchange the synchronisation source, which worked as reference, for another synchronisation source. Also during a change of the network structure and during network element updates such a situation may occur, when the phase lock of the receiving equipment must change the synchronisation source. The phase lock must be able to cope also with such situations.

Figure 1:
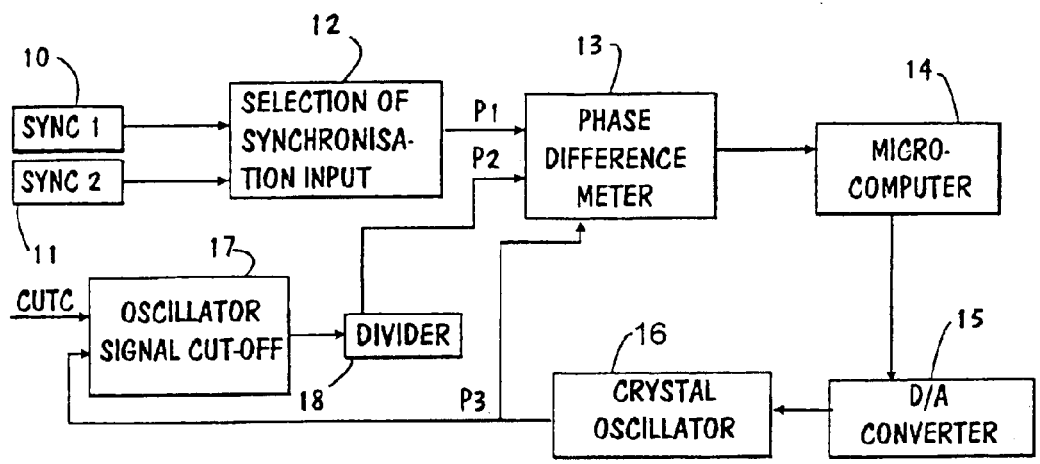

A typical phase lock structure is shown in FIG. 1. The phase difference meter 13 compares the phase difference between signal P1 selected as reference signal and signal P2 formed by dividing from oscillator signal P3 by calculating, how many pulses of oscillator signal P3 can be accommodated between the rising or falling edges of the signals to be compared. For example, the frequency of signal P2 may be two times the frequency of signal P1. The frequency of signal P3 is considerably higher than the frequencies of signals P1 and P2.

Microcomputer 14 must form a control word for the D/A converter. The control word is obtained from the results of measurements performed by phase difference meter 13. From measurements obtained during a certain measuring period, the microcomputer calculates an average, which together with an average calculated earlier is used for forming the control word.

D/A converter 15 converts the control word from digital form into analog form, which after the conversion is supplied to crystal oscillator 16. The crystal oscillator generates signal P3, which is used for generating signal P2 for use in the phase difference measurement.

Divider 18 receives signal P3 from cut-off circuit 17 of the oscillator signal. The cut-off circuit is intended to control the exchange of synchronisation signal sources. If for some reason it is desired in selection circuit 12 to exchange the signal of synchronisation source 10 for the signal of another synchronisation source 11, then the microcomputer 14 of the phase lock will with signal CUTC prevent the oscillator signal from having access to the divider forming signal P2 for a time T at a time. After the cut-off, the phase of signal P2 seen by the phase difference meter will transfer by time constant T compared with the phase of signal P1. By performing a suitable number of signal cut-off operations and by reading the value of the phase difference meter after each cut-off, it is possible to set the phase difference of signals P1 and P2, whose phases are compared, with an accuracy of time constant T at the average SETM of the phase meter. Thus, the phase difference is transferred by successive cut-offs as close as possible to the above-mentioned average.

FIG. 1 shows the structure of a typical state-of-the-art phase lock. It is obvious that the structure can also be of another kind. For example, divider 18 and the signal cut-off function 17 may be functionally connected between selection circuit 12 of the synchronisation input and phase difference meter 13. Hereby the microcomputer will give a cut-off command CUTC to cut off signal P1. There may be a divider and a cut-off circuit also in both the places mentioned.

Figure 2:
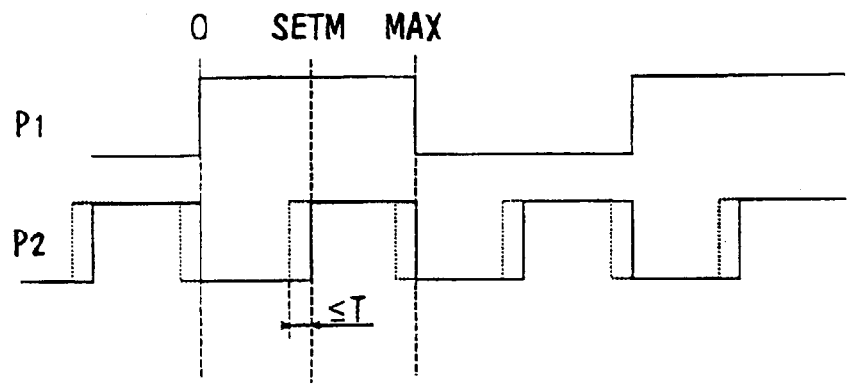

In FIG. 2 a dashed line illustrates a situation, where a cut-off operation taking place during a change of synchronisation signal has allocated the phase of signal P2 at a desired value with a precision of time constant T. The selected setting value is an average SETM of the maximum possible number of pulses between the above-mentioned rising or falling edges. Signal P2 shown by a solid line shows the desired relative location of phases.

Figure 3:
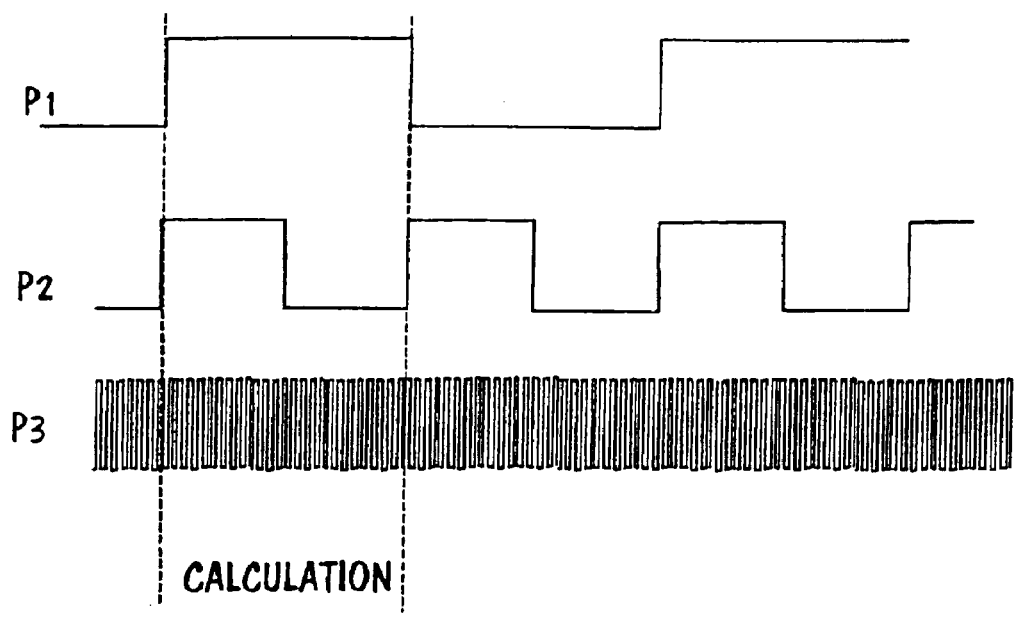

FIG. 3 shows a time slot of the calculation to be performed in the phase difference meter. In this example, the calculation starts from the rising edge of signal P1 and ends at the following rising edge of signal P2.

The phase lock is started after the phase setting described above, whereby the phase difference will set at setting value SETM within a certain setting time. During the setting time, such an undesirable phase transfer occurs in the output signal of the phase lock, which may cause transfer errors or e.g. buffer overflows.

Figure 4:
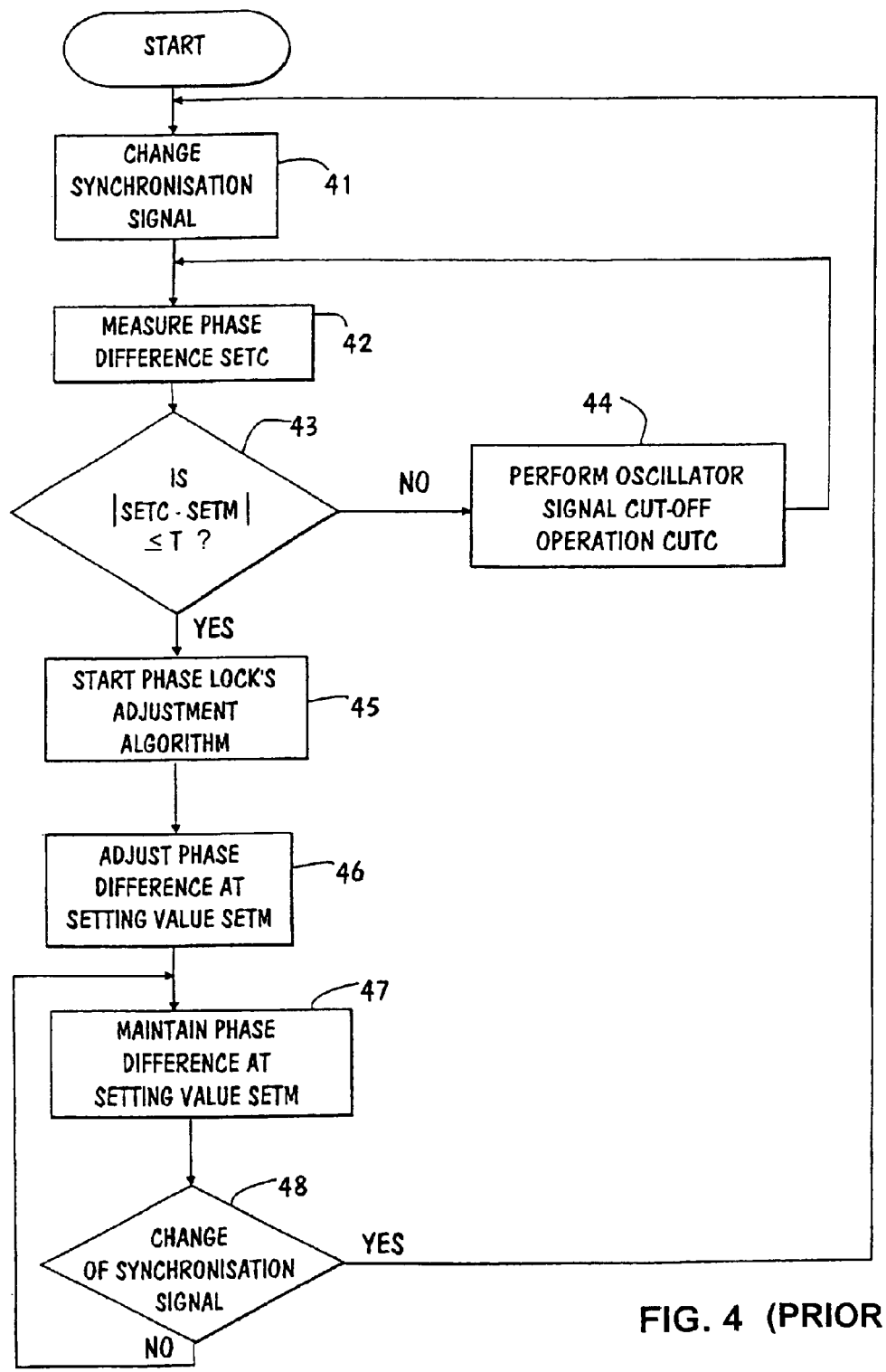

FIG. 4 illustrates in flow chart form a state-of-the-art method for changing the synchronisation source in a phase lock. When a decision on exchange of synchronisation signal is desired in the system (step 48), a change measure is taken (step 41). If a change of synchronisation signal is not desired, the phase lock continues to maintain the phase difference at its setting value SETM (step 47).

After the change of synchronisation signal, the phase difference meter measures the phase difference SETC (step 42). The measurement value of the phase difference meter is compared with the phase difference setting value (step 43). If the absolute value of their difference is higher than the value of time constant T, an oscillator signal cut-off operation is performed (step 44) by giving a CUTC command. But if the said absolute value is lower than or equal to the value of time constant T, then the adjustment algorithm of the phase lock is started in step 45. The adjustment algorithm aims at adjusting the phase difference at its setting value SETM (step 46). When the setting value is reached, the adjustment algorithm will aim at maintaining the phase difference at its setting value (step 47).

The phase transfer occurring in the change of synchronisation source is a problem with the state of the art described in the foregoing. This phase error is seen in the output signal, and it may cause trouble situations, such as e.g. transfer errors or buffer overflows.

The present invention aims at avoiding the described state-of-the-art problem. This aim is achieved in the manner described in the independent claims.

BRIEF SUMMARY OF THE INVENTION

The method in accordance with the invention at first works in the same manner as described above during a change of synchronisation source. The phase difference between the selected reference signal and the signal formed by dividing from the oscillator signal is set with the aid of cut-off circuit at the setting value of the phase difference with time constant accuracy.

Thereupon, in the method according to the invention, the current value of phase difference obtained by cut-off circuit is in fact used as a steady state setting value, instead of the average value of the phase difference meter or any other predetermined fixed value. Thus, the method according to the invention begins using a reference signal-specific current value as the setting value. Since the setting value is thus adaptively determined according to the signal of the current synchronisation source, no phase transfer will occur during the change.

LIST OF FIGURES

Figure 5:
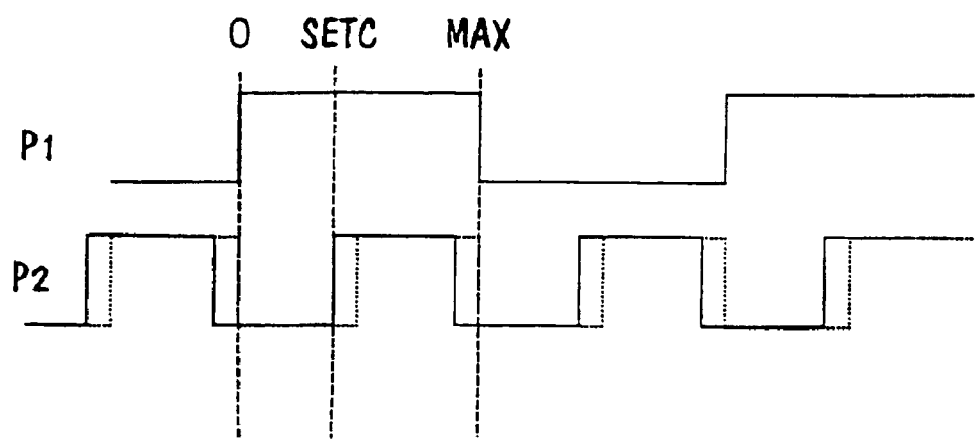
Figure 6:
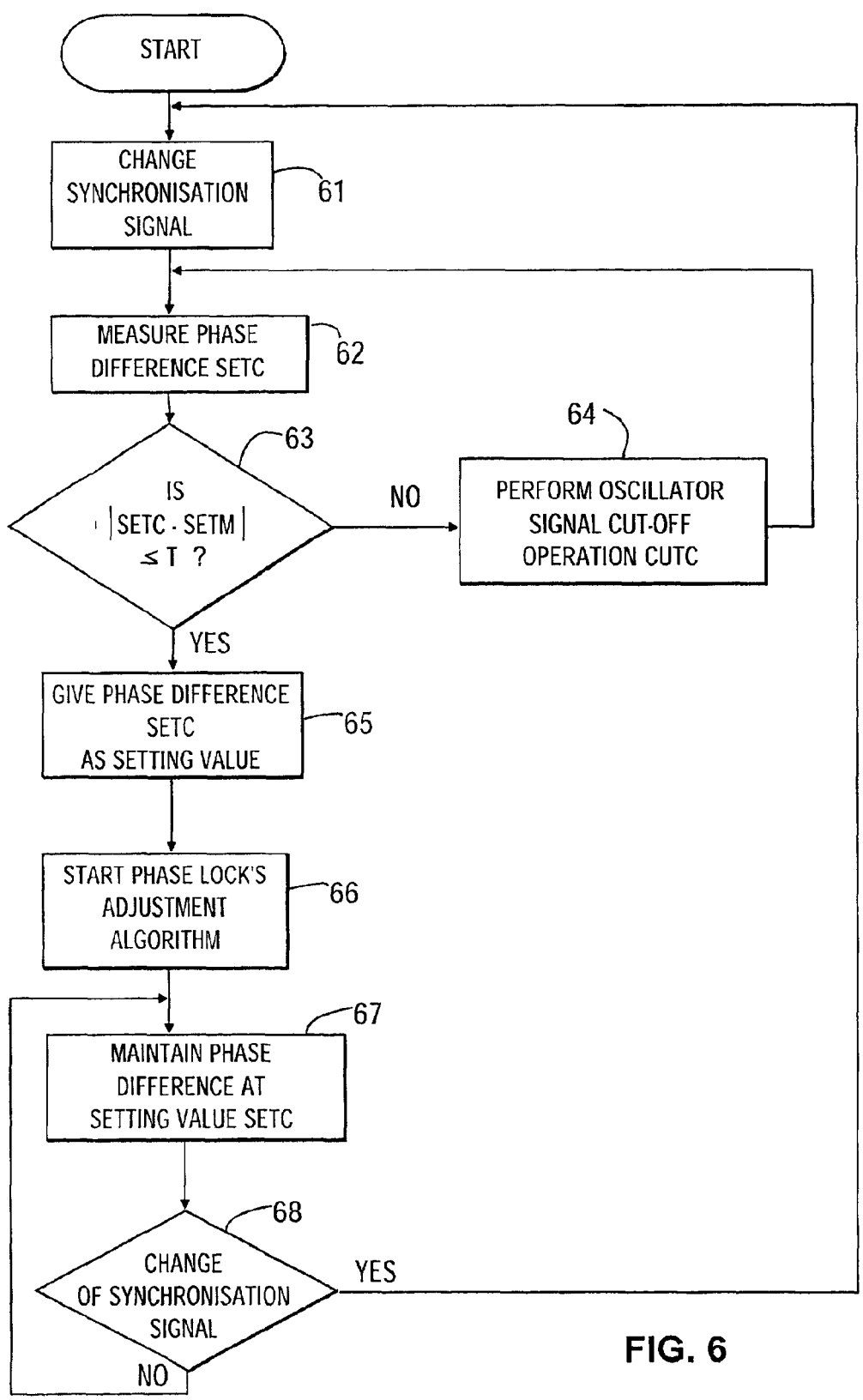

In the following, the invention will be described in greater detail with reference to the examples in FIGS. 2 ... 6 shown in the appended drawings, wherein FIG. 1 shows a state-of-the-art phase lock circuit, FIG. 2 shows allocation by cut-off circuit of signals, whose phases are to be compared, FIG. 3 shows calculation performed by a phase difference meter between rising edges, FIG. 4 illustrates in flow chart form the operation of a state-of-the-art phase lock during a change of synchronisation source, FIG. 5 shows phase value setting in accordance with the invention, and FIG. 6 illustrates in flow chart form the operation of a phase lock according to the invention, during a change of synchronisation source.

DESCRIPTION OF THE INVENTION IN DETAIL

The adjusting function of the phase lock can be divided into two parts: into a normal adjustment mode and into a reference signal exchange mode taking place during a change of synchronisation source. In the normal adjustment mode, the phase lock aims at keeping the crystal oscillator frequency as close as possible to the reference source frequency, while in the exchange mode the phase lock aims at setting the crystal oscillator frequency as close as possible to the reference source frequency.

It should be noted, that during the change of synchronisation source the adjustment algorithm thus works in two different modes of operation: first in the exchange mode, and thereupon in the normal mode, which adjusts the oscillator signal into the final desired phase.

FIG. 3 shows calculation taking place in the phase difference meter. The phase comparator calculates, how many pulses of signal P3 can be accommodated between the rising edge of signal P1 and the rising edge of signal P2. The adjustment algorithm of the microcomputer has a setting value for a number of pulses, by which the phase lock attempts to keep the phasing in place.

The normal mode of the phase lock tries to keep the phasing at this desired setting value. However, during a change of reference signal, the phase difference of signals P1 and P2 may be so great, that the desired phasing with a certain accuracy is achieved in a shorter time with the cut-off operation of the oscillator signal described in the foregoing.

The SETM setting value is an originally fixed value already programmed at the factory into the phase lock's microcomputer. As was described above, successive cut-off steps can be taken to allocate signal P2 at the SETM setting value with an accuracy of time constant T. SETC is the current value of the phase difference obtained as the result of the phase difference measurement after the last cut-off. FIG. 5 shows the SETC value thus obtained in relation to signals P1 and P2. By setting SETC as the desired phase difference value instead of SETM, the fixed phase difference value, no such phase transfer will occur, which is shown in FIG. 2, but the phase lock is directly at its desired value after the cut-off connection taking place during the change of synchronisation signal. The normal mode of adjustment may begin operating from an ideal situation. Signal P2 shown in FIG. 5 by a solid line depicts a signal stage, where the phase lock is going over to the normal mode. The signal drawn with a dashed line illustrates a situation, into which signal P2 ought to set in the phase lock's normal mode, if the SETM value would be used as the setting value.

The method according to the invention, is shown as a flow chart in FIG. 6. In other respects the function is similar to the known method described above, but differences will occur after signal P1 or P2 is directed by successive cut-off steps close to the setting value of the phase difference (step 63). Before going over to the normal mode of the phase lock, the phase lock's adjustment algorithm is given SETC, the phase difference current value obtained from the phase difference measurement as the result of transfer of signal P1 or P2, as a new setting value of the phase value (step 65). Only thereafter the phase lock's adjustment algorithm is started (step 66). Thus, the state-of-the-art adjustment of the phase difference at its setting value as shown in FIG. 4 (step 46) is left out.

Thus, the method according to the invention moves on from the use of a fixed setting value of the phase difference to a synchronisation signal-specific measurement value of the phase difference. The change of setting value takes place in the exchange mode of the synchronisation source, when it is noticed that the phase difference is sufficiently close to a certain fixed value. For this reason, the change of synchronisation signal will not cause any phase transfer in the output signal of the phase lock.

Although the invention was described above with reference to the examples shown in the appended drawings, it is self-evident to professionals in the branch that the invention can be modified within the scope of the inventive idea described above and in the appended claims. The solution can be applied in different operating environments and applications. For example, phase transfer of the signal to be compared can also happen in other ways than by cutting off the signal.

What is claimed is:

1. A method for controlling a phase locked loop during change of synchronisation source, wherein a fixed setting value of the phase difference is originally set for the phase locked loop, the method comprising:

changing a synchronisation signal from a first synchronisation to a second synchronisation signal;

measuring a phase difference between said second synchronisation signal and a signal formed in a phase lock's oscillator;

comparing the measured phase difference to a predetermined limit value;

when the comparing step shows that the measured phase difference is greater than the predetermined limit value, changing the phase difference between the second synchronisation signal and the signal formed from the phase lock's oscillator repeating the measuring and comparing steps until the measured phase difference is less than or equal to a said predetermined limit value; and when the comparing step shows that the measured phase difference is less than or equal to said predetermined limit value, setting the measured phase difference as a new setting value for the phase difference for use in the normal adjustment function of the phase locked loop instead of the fixed setting value.

2. The method as defined in claim 1, wherein phase transfer of the second synchronisation signal is carried out by preventing for a certain time access of the signal formed from the phase lock's oscillator to a component measuring the phase difference of the phase locked loop.

3. The method as defined in claim 2, wherein preventing takes place by cutting off a functional route of the signal formed from the oscillator to the component measuring the phase difference of the phase locked loop.

4. The method as defined in claim 2, wherein preventing takes place by cutting off a functional route of the second synchronisation signal to the component measuring the phase difference of the phase locked loop.

5. A digital phase lock arrangement, comprising:

selection components configured to select a desired synchronisation source from a set of at least two different synchronisation sources;

a phase comparator having a first and a second input, configured to generate an output signal dependent on a phase difference between signals supplied to the inputs;

controllers configured to form a control word in response to an output signal which is dependent on the phase difference; and an oscillator, which is controlled with the aid of said control word;

said controllers comprising setting components configured to set a measured phase difference as a new setting value for a normal adjustment function of the phase lock arrangement instead of a fixed setting value of the phase difference originally set for the arrangement.

6. The arrangement as defined in claim 4, which includes starting components for starting the normal adjustment function of the loop, wherein said starting components respond to the setting components in order to start the adjustment function in response to a setting of a setting value.

* * * * *